United States Patent
Cui et al.

(10) Patent No.: US 10,115,930 B2
(45) Date of Patent: Oct. 30, 2018

(54) COMBINED INTERNAL AND EXTERNAL EXTRACTION LAYERS FOR ENHANCED LIGHT OUTCOUPLING FOR ORGANIC LIGHT EMITTING DEVICE

(71) Applicants: Universal Display Corporation, Ewing, NJ (US); Kent State University, Kent, OH (US)

(72) Inventors: Yue Cui, Kent, OH (US); Deng-ke Yang, Hudson, OH (US); Gregory McGraw, Yardley, PA (US); Ruiqing Ma, Morristown, NJ (US); Julia J. Brown, Yardley, PA (US)

(73) Assignees: Universal Display Corporation, Ewing, NJ (US); Kent State University, Kent, OH (US)

( * ) Notice: Subject to any disclaimer, the term of this patent is extended or adjusted under 35 U.S.C. 154(b) by 0 days.

(21) Appl. No.: 14/325,509

(22) Filed: Jul. 8, 2014

(65) Prior Publication Data
US 2016/0013449 A1    Jan. 14, 2016

(51) Int. Cl.
*H01L 51/52* (2006.01)
*H01L 51/56* (2006.01)

(52) U.S. Cl.
CPC ...... *H01L 51/5275* (2013.01); *H01L 51/5206* (2013.01); *H01L 51/5262* (2013.01); *H01L 51/56* (2013.01); *H01L 2251/5315* (2013.01)

(58) Field of Classification Search
CPC ............. H01L 51/5212; H01L 51/5271; H01L 51/5203; H01L 51/5012; H01L 51/5284; H01L 2251/5315; H01L 51/442; H01L 27/3258; H01L 51/50; H01L 51/5072; H01L 51/52; H01L 2251/5338;
(Continued)

(56) References Cited

U.S. PATENT DOCUMENTS

| 4,769,292 A | 9/1988 | Tang et al. |
| 5,247,190 A | 9/1993 | Friend et al. |

(Continued)

FOREIGN PATENT DOCUMENTS

| CN | 1822729 A | 8/2006 |
| CN | 102694128 A | 9/2012 |

(Continued)

OTHER PUBLICATIONS

Baldo et al., "Highly efficient phosphorescent emission from organic electroluminescent devices", Nature, vol. 395, pp. 151-154, 1998.
(Continued)

*Primary Examiner* — Mohsen Ahmadi
*Assistant Examiner* — Gustavo Ramallo
(74) *Attorney, Agent, or Firm* — Morris & Kamlay LLP

(57) ABSTRACT

OLED structures including an internal extraction layer are provided. The internal extraction layer includes a material having a refractive index that is higher than the refractive index of a transparent electrode in the device, and a non-planar interface disposed between the material and the substrate. Devices are also provided that include an external extraction layer having a non-planar surface which, when used in conjunction with an internal extraction layer, provides greatly improved outcoupling of light generated by the device.

22 Claims, 20 Drawing Sheets

(58) Field of Classification Search
CPC ......... H01L 2251/5361; H01L 27/3209; H01L 33/38; H01L 2924/12044; H01L 33/24; H01L 1/62; H01L 51/0032; H01L 51/5262; H01L 51/5278; G02F 1/1335
See application file for complete search history.

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,211,613 | B1 * | 4/2001 | May ............... H01L 27/32 313/504 |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,984,934 | B2 | 1/2006 | Möller et al. |
| 7,053,547 | B2 * | 5/2006 | Lu et al. ............. 313/506 |
| 7,279,704 | B2 | 10/2007 | Walters et al. |
| 7,431,968 | B1 | 10/2008 | Shtein et al. |
| 7,560,727 | B2 | 7/2009 | Ishikawa |
| 7,800,301 | B2 | 9/2010 | Ishikawa et al. |
| 7,968,146 | B2 | 6/2011 | Wagner et al. |
| 8,092,924 | B2 * | 1/2012 | Kwong et al. ........ 428/690 |
| 8,257,793 | B2 | 9/2012 | Forrest |
| 2003/0230980 | A1 | 12/2003 | Forrest et al. |
| 2004/0174116 | A1 | 9/2004 | Lu et al. |
| 2009/0015142 | A1 * | 1/2009 | Potts ............... B82Y 20/00 313/504 |
| 2009/0015757 | A1 | 1/2009 | Potts et al. |
| 2009/0153972 | A1 | 6/2009 | Nakamura et al. |
| 2011/0084599 | A1 * | 4/2011 | Brooks et al. ......... 313/504 |
| 2012/0049168 | A1 * | 3/2012 | Inbasekaran et al. ..... 257/40 |
| 2012/0184087 | A1 * | 7/2012 | Peeters ............... 438/478 |
| 2013/0329299 | A1 | 12/2013 | Kim et al. |
| 2014/0001448 | A1 | 1/2014 | Naraoka et al. |
| 2014/0042426 | A1 | 2/2014 | Nishimura et al. |
| 2014/0103314 | A1 * | 4/2014 | Satoh ............... H01L 51/5271 257/40 |
| 2014/0276247 | A1 * | 9/2014 | Hall et al. ................ 601/2 |
| 2014/0306213 | A1 | 10/2014 | Sato et al. |
| 2015/0001470 | A1 * | 1/2015 | Ma ............... H01L 51/52 257/40 |
| 2015/0060840 | A1 | 3/2015 | Jeong et al. |
| 2016/0013449 | A1 * | 1/2016 | Cui ............... H01L 51/5275 257/40 |

FOREIGN PATENT DOCUMENTS

| | | |
|---|---|---|
| CN | 103430056 A | 12/2013 |
| JP | 2013127844 A | 6/2013 |
| JP | 2014082024 A | 5/2014 |
| KR | 2014048796 A | 4/2014 |
| WO | 2008057394 | 5/2008 |
| WO | 2009014707 A2 | 1/2009 |
| WO | 2009017035 A1 | 2/2009 |
| WO | 2010011390 | 1/2010 |
| WO | 2010113737 A1 | 10/2010 |
| WO | 2012147759 A1 | 11/2012 |
| WO | 2013187149 A1 | 12/2013 |

OTHER PUBLICATIONS

Baldo et al.,"Very high-efficiency green organic light-emitting devices based on electrophosphorescence", Applied Physics Letters, vol. 75, No. 1, pp. 4-6, Jul. 5, 1999.

Becker, E.W. et al.,"Fabrication of microstructures with high aspect ratios and great structural heights by synchrotron radiation lithography, galvanoforming, and plastic moulding (LIGA process)", Microelectronic Engineering 4 (1986) 35-56, North Holland.

Becker, Holger et al.,"Hot embossing as a method for the fabrication of polymer high aspect ratio structures", Sensors and Actuators 83 (2000), pp. 130-135.

Kuo, Shu-Ming et al.,"Fabrication of aspherical SU-8 microlens array utilizing novel stamping process and electrostatic pulling method", 2010 Optical Society of America—vol. 18, No. 18 / Optics Express, Aug. 25, 2010.

Liu, K.H. et al.,"Fabrication of an aspherical microlens for OLED with modified etching process", 2010 International Conference on Electrical and Control Engineering.

Moeller, S. et al.,"Improved light emitting diodes employing ordered microlens arrays", Journal of Applied Physics 91, 3324 (2002); doi: 1063/1.1435422.

Morford, Robert et al.,"Press-patterned UV-curable high refractive index coatings", Proceedings of SPIE, vol. 6123, Society of Photo-Optical Instrumentation Engineers, 2006, pp. 612301-1-612301-11.

Schubert, E. F.,"LED basics: Optical properties", Light Emitting Diodes 2nd Edition University Press, Cambridge (2010).

EESR for EP 15175677.2, dated Nov. 16, 2015.

JP 2015-136380 Notice of Reasons for Rejection, dispatched Aug. 25, 2015.

Office Action dated Sep. 23, 2016 as received in EP Application No. 15175677.2.

Soon Moon: "Effect of Photonic Structures in OLEDs—Light Extraction and Polarization Characteristics" In: "Organic Light Emitting Devices", InTech, 1-40, Nov. 14, 2012.

Yokoyama: "Wide-Range Refractive Index Control of Org. Semiconductor Films Toward Adv. Optical Design of Organic Optoelectronic Devices", Adv Mat, v24, n47, 6368-6373 Dec. 11, 2012.

CN Office Action dated Aug. 1, 2017 for CN App. No. 201510398380.3 (13 pages).

\* cited by examiner

FIG. 12
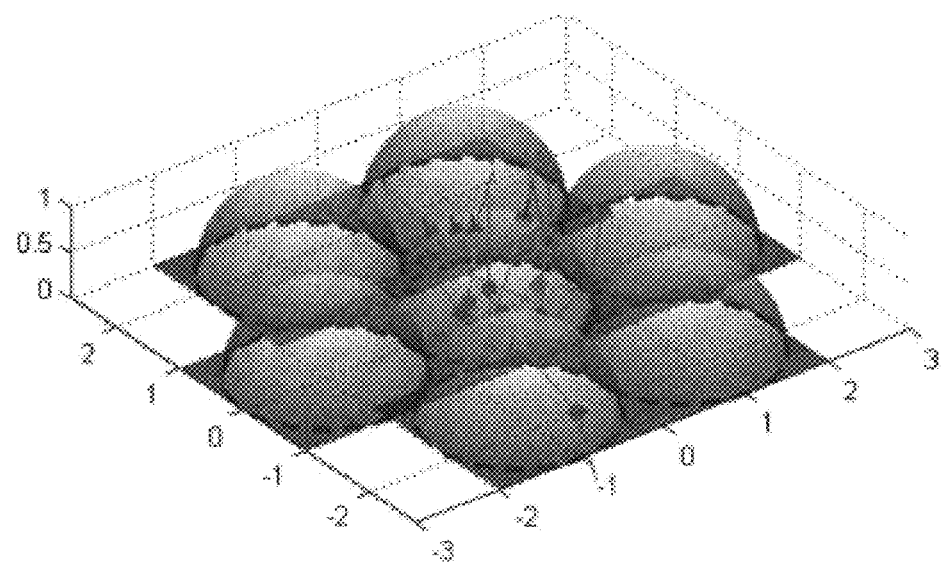
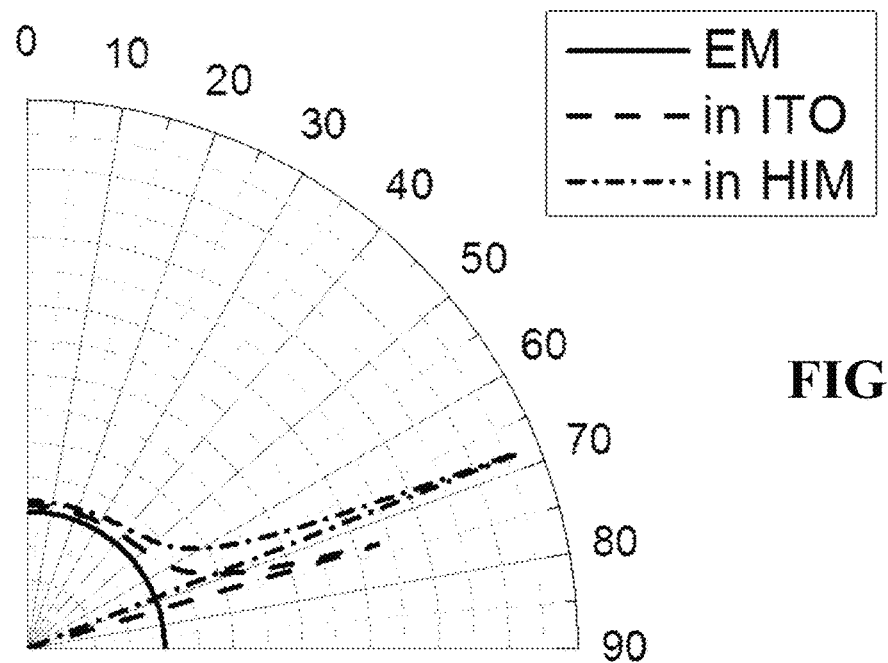
FIG. 13

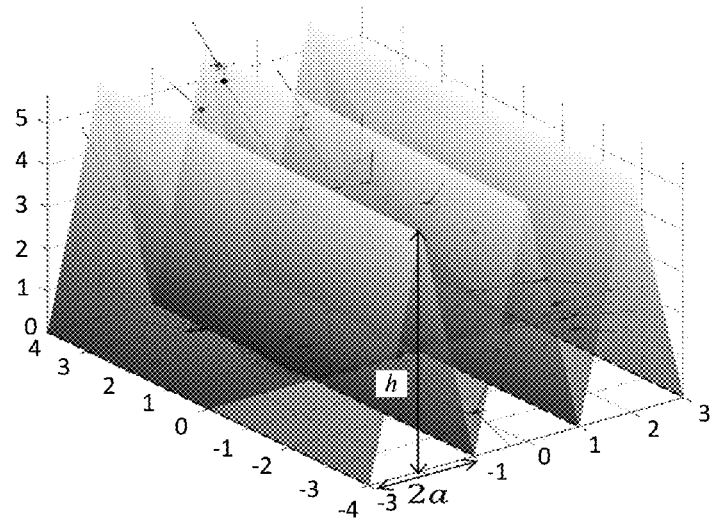
FIG. 14
FIG. 15
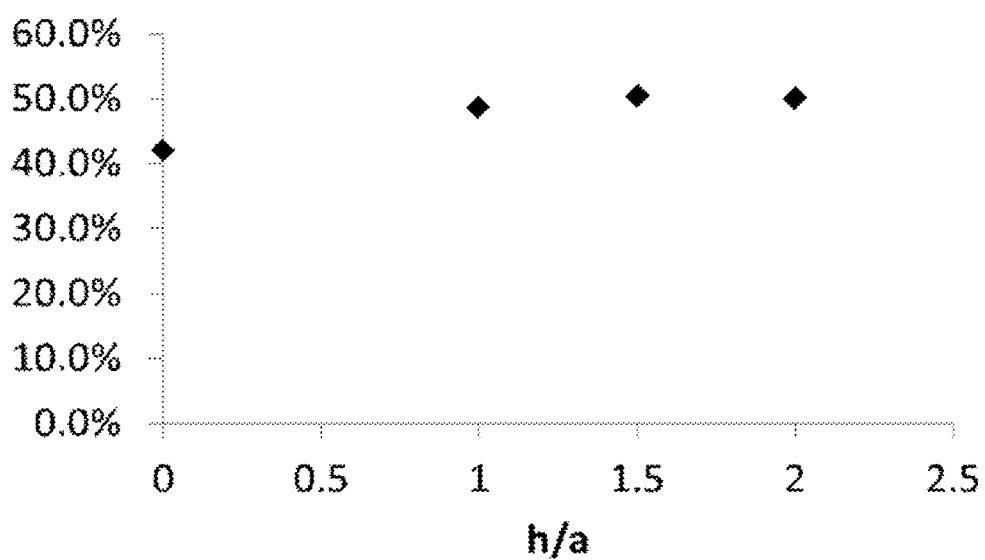

1810　　　　1820　　　　1830　　　　1840

COMBINED INTERNAL AND EXTERNAL EXTRACTION LAYERS FOR ENHANCED LIGHT OUTCOUPLING FOR ORGANIC LIGHT EMITTING DEVICE

The claimed invention was made by, on behalf of, and/or in connection with one or more of the following parties to a joint university corporation research agreement: Regents of the University of Michigan, Princeton University, The University of Southern California, Kent State University and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs) and, more specifically, to OLEDs having multiple or combined extraction layers for light outcoupling.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

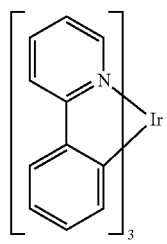

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an aspect of the invention, an organic light emitting device includes a substrate; a transparent first electrode having a first index of refraction, disposed adjacent to the substrate; a second electrode; an organic emissive layer disposed between the transparent first electrode and the second electrode, the organic emissive layer having a second index of refraction; and an internal extraction layer disposed between the substrate and the transparent first electrode. The internal extraction layer may include a first material having an index of refraction at least 0.01 greater than the second index of refraction, and a non-planar interface between the first material and a material adjacent to the first material. The internal extraction layer may include a second material having a third index of refraction different than the index of refraction of the first material. The first material may have an index of refraction of, for example, not less than 1.7, not less than 1.9, or the like. The non-planar interface may be, for example, an interface between the first material and the second material. The internal extraction layer also may include a second non-planar interface between the first material and the substrate. The non-planar interface may be an interface between the first material and the substrate, and may include one or more topographical patterns such has grooves, pyramidal features, and prismatic features. The index of refraction of the first material may be at least 0.01 higher than the first index of refraction. An external extraction layer may be disposed adjacent to the substrate, wherein the substrate is disposed between the internal extraction layer and the external extraction layer. The substrate and the external extraction layer may be made of, or include, the same material or materials. The substrate may have an index of refraction of not less than 1.65. The external extraction layer may have an index of refraction within 0.01 of the index of refraction of the substrate. The external extraction layer also may include a non-planar surface, which may include, for example, one or more topographical patterns such as grooves, hemispherical features, and axially symmetric cubic profile features. The internal extraction layer may have a minimum thickness of at least 1 µm. The external extraction layer also may include one or more microlenses. Each microlens may be defined by a surface on which each point has a tangent plane that forms an interior angle of not more than 90 degrees with an interface of the outcoupling layer and the organic light emitting device. Each microlens also may have a lens height H and a largest base measurement 2R, where H/R is greater than 1. Alternatively or in addition, each microlens or a layer of microlenses may have a thickness profile defined by a continuous function in r, wherein r is the distance from an axis of the microlens centered on the base of the microlens and normal to the interface of the outcoupling layer with the organic light emitting device, and wherein r is less than or equal to R. The microlenses may be closely packed and/or arranged in a repeating pattern, and microlenses of different base measurements may be used to achieve more complete coverage of the device.

In an aspect of the invention, a method of fabricating an OLED includes forming an internal extraction layer pattern on a first surface of a substrate, where the substrate includes a material having a first index of refraction; forming an external extraction layer pattern on a second surface of the substrate, opposite the first surface; depositing an internal extraction layer over the internal extraction layer pattern of the first surface of the substrate, where the internal extraction layer includes a material having an index of refraction at least 0.01 greater than the first index of refraction; and fabricating an OLED over the internal extraction layer.

BRIEF DESCRIPTION OF THE DRAWINGS

FIG. 12 shows an example of rays propagating from an array of microlenses as disclosed herein.

FIG. 13 shows a normalized polar distribution of emitted light intensity in the layers of an OLED with an internal extraction layer as disclosed herein.

FIG. 14 shows the topography of an example extraction layer with triangular groove features as disclosed herein.

FIG. 15 shows the fraction of light outcoupled from an internal extraction layer to the substrate as a function of feature aspect ratio as disclosed herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
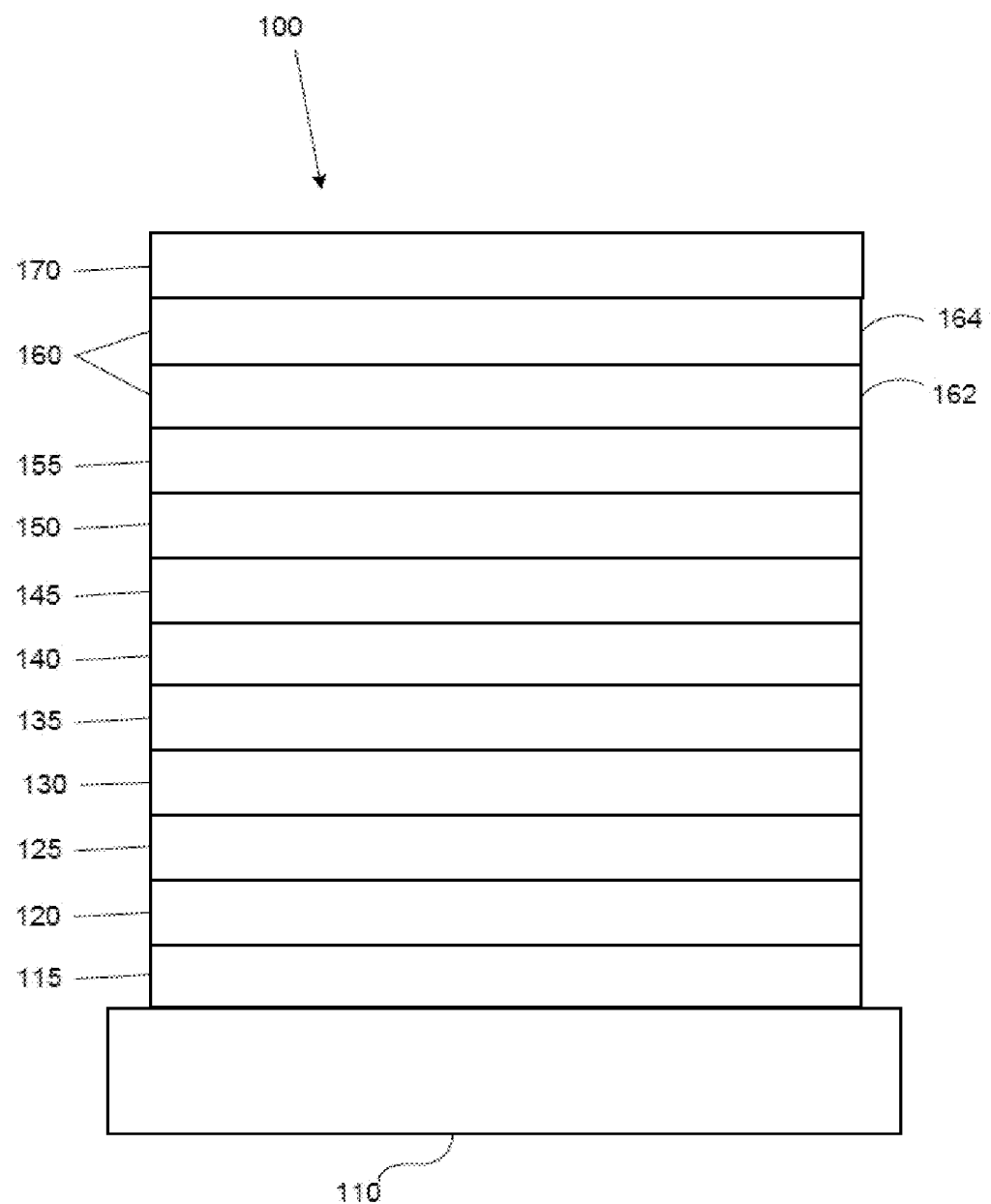
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
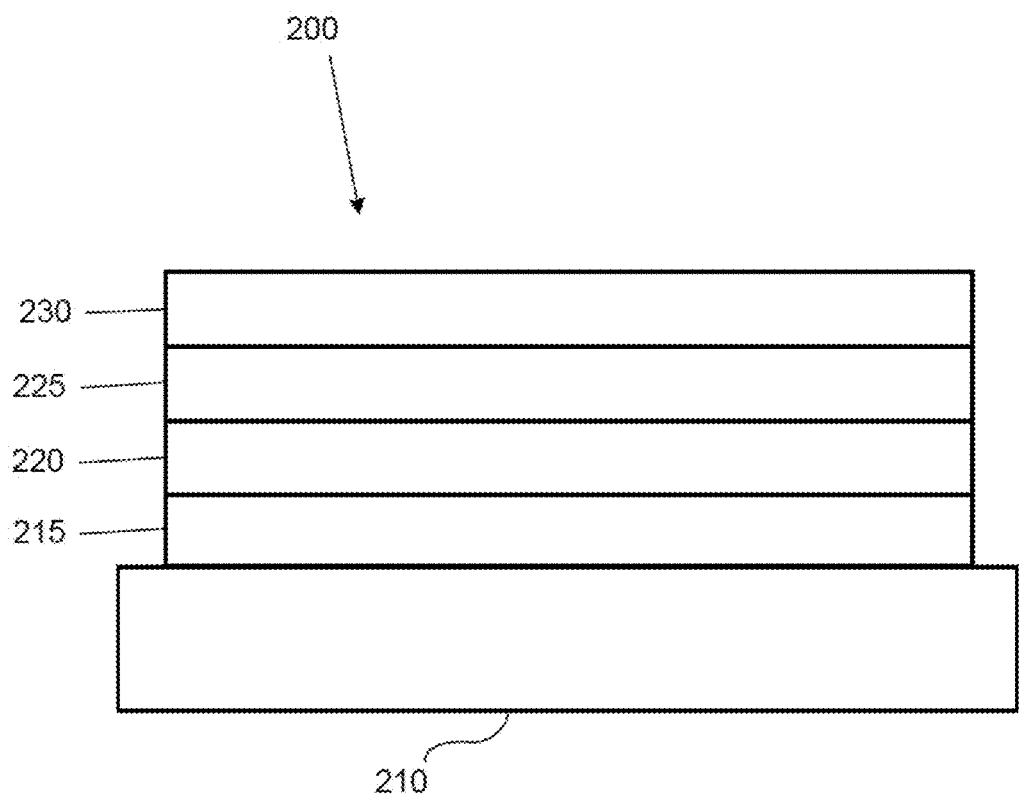
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The majority of light generated within a conventional OLED often does not radiate beyond the device due to effects such as internal reflection caused, for example, by mismatches in refractive indexes between various components or layers of the OLED, or between the OLED and the surrounding medium (typically air). Structures that outcouple this otherwise-lost light into air modes can increase the efficiency of an OLED. Outcoupling techniques and structures as described herein provide transparent substrates having optical features, without requiring changes to the electronically-active layers of the OLED. Thus, embodiments disclosed herein can be used with a wide variety of OLED architectures, and may be particularly suitable for use with bottom-emitting OLEDs.

Figure 3:
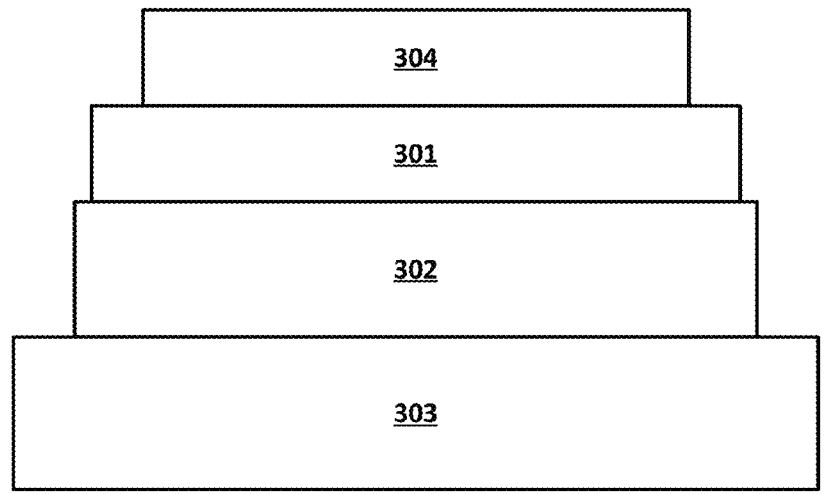
FIG. 3 shows a conventional bottom emitting OLED with no outcoupling enhancement features.

A conventional bottom-emitting OLED is shown in FIG. 3. Generally, such a device may include various layers as previously described with respect to FIGS. 1-2, though some example layers and structures are omitted from FIG. 3 for illustration purposes. The organic layers 301 and the transparent anode 302 typically have an index of refraction n of up to 1.9, while for a typical substrate 303, n typically is about 1.5. Light trapped by the interface between the anode 302 and the substrate 303 becomes confined to a region between the cathode 304 and the anode—substrate interface of the OLED. The trapped light typically is referred to as organic mode or anode mode waveguided light. This region typically is thinner than the wavelength of visible light, so the waveguided modes into which the light is confined are best described using Maxwell's equations.

Typically the refractive index of the substrate 303 is about 1.5. Thus, in addition to the anode-substrate interface, light may become trapped by the substrate-air interface due to the mismatch in refractive indices between the substrate and air (n=1). In this case, light may be confined between the air interface and the reflective electrode. Since the substrate typically is much thicker than a wavelength of light (100-

1000 μm), light is trapped by total internal reflection (TIR) that is best modeled using ray optics.

Figure 4:
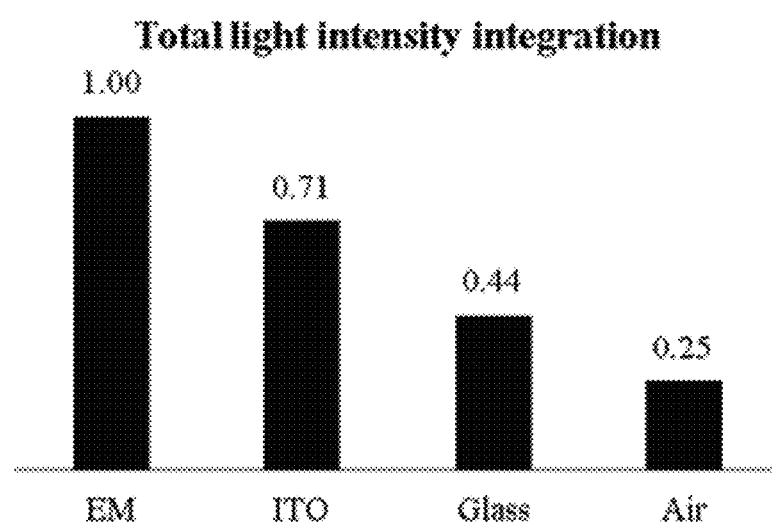
FIG. 4 shows the fraction of light outcoupled through each layer of a conventional OLED.

In either case, light energy that does not leave the device on the first encounter with one of these interfaces typically becomes irreversibly trapped, and is ultimately absorbed within the device structure. FIG. 4 shows results of an example calculation of the fraction of generated light that is expected to outcouple through each successive layer in a conventional bottom emitting OLED such as shown in FIG. 3, as predicted by Berreman's matrix method. In the example, the light has a wavelength of 500 nm, and the organic layers are 120 nm thick. Out of 100% of light generated in the OLED emissive layer (EM), 71% passes through a transparent indium tin oxide (ITO) anode. The glass substrate (n=1.5) receives 44% of the original light, and 25% of the original light is transmitted through the substrate and outcoupled to air. Thus, of the light generated by the emissive layers, only about 25% can be expected to exit the device. Although calculated for specific structure and materials, similar results typically are observed for other structures and materials used in conventional OLEDs.

Figure 5:
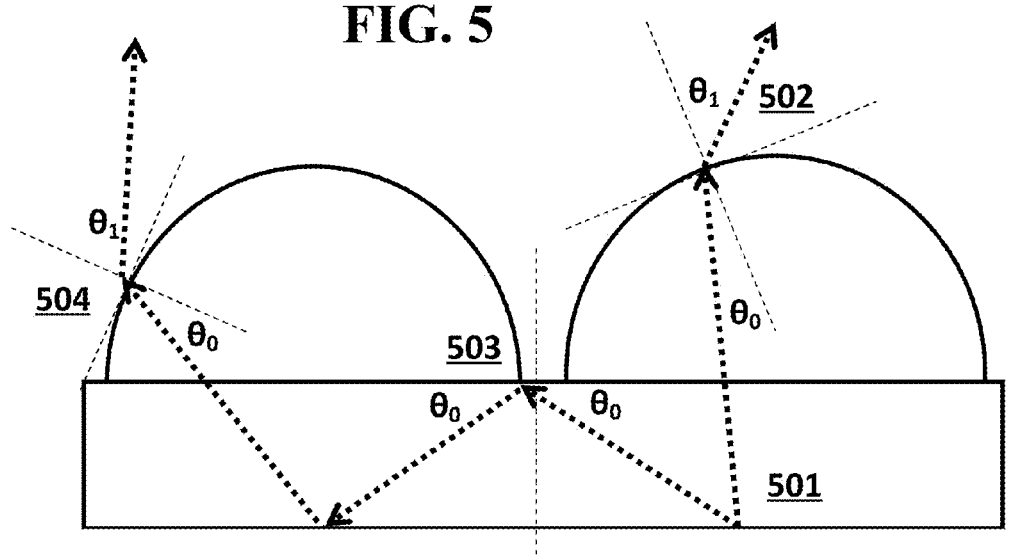
FIG. 5 shows examples of typical paths of light through a microlens array external extraction layer as disclosed herein.

Light trapped in the substrate may be outcoupled by an external extraction layer (EEL) using geometric optics. For example, topographical features on the outer surface of the substrate may present an interface with variable tangent planes relative to the plane of the OLED, as shown in FIG. 5. The angle of incidence of the ray with respect to the tangent plane of the substrate surface at the intersection determines whether the light ray from source 501 outcouples to air as shown by ray 502 or is reflected as shown at 503. Snell's law states that $n_0 \sin(\theta_0) = n_1 \sin(\theta_1)$, where $n_0$ and $n_1$ are the indices of refraction of the substrate and air, respectively, and $\theta_0$ and $\theta_1$ are the angles of incident and refracted rays relative to the interface normal plane. Light is refracted if $\theta_1$ has a real solution. If there is none, the light is reflected. Reflected light is likely to be outcoupled when it intersects the interface a second time 504, since it intersects at a point with a different tangent plane.

Figure 6:
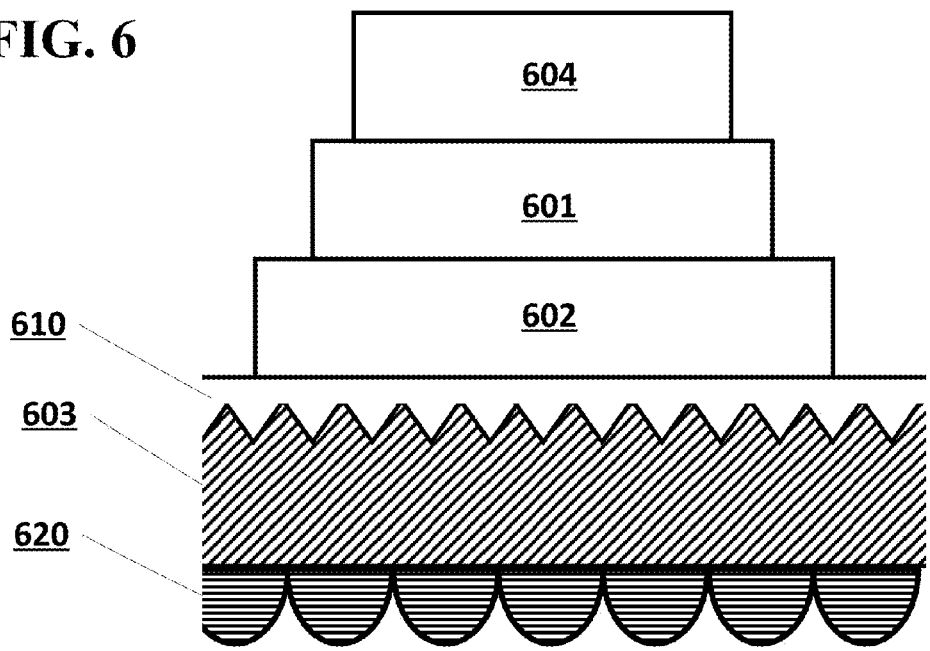
FIG. 6 shows a schematic representation of a bottom emitting OLED incorporating internal and external extraction layers as disclosed herein.

Embodiments of the present invention provide internal and external outcoupling structures. FIG. 6 shows an example of an embodiment disclosed herein, which includes internal and external outcoupling layers that complement each other and thereby enhance outcoupling efficiency. The device shown in FIG. 6 may include layers such as those previously described with respect to FIGS. 1-3, including one or more organic layers 601 such as organic emissive layers, an anode 602, substrate 603, and cathode 604. In the example configuration shown, waveguided modes are suppressed by coating the substrate with a material 610 that has a refractive index comparable to, or greater than that of the anode. It may be possible to mitigate wavelength-dependent effects, such as thin film interference, if the coating 610 is made sufficiently thick, e.g., several wavelengths of light. This optically-thick film may then function as an internal extraction layer (IEL) that efficiently outcouples a broad spectrum of light. The interface between the IEL and substrate may be configured to refract light rays onto trajectories that are most efficiently coupled by the external extraction layer. The EEL 620 includes a textured surface of the same index of refraction as the substrate at the substrate to air interface, and may be optimized to work with the internal extraction layer.

More generally, embodiments of the invention may include an internal extraction layer formed from a particular material and disposed between a substrate and an electrode, which includes a non-planar interface. Preferably, the material has an index of refraction at least 0.05 higher than the index of refraction of the adjacent electrode. FIG. 7 shows a schematic representation of such a device. The device includes one or more organic layers 720 as previously described, disposed between two electrodes 710, 730. One electrode 730 is transparent as previously described. An internal extraction layer 701 is disposed between the substrate 740 and the electrode 730. The internal extraction layer 701 may include a material having an index of refraction that is at least 0.05 higher than the index of refraction of the electrode 730.

As shown in FIG. 7, the interface between the material of the internal extraction layer 701 and the electrode 730 may be non-planar. As disclosed herein, an interface or surface is "non-planar" if it includes topographical features. Non-limiting examples of topographical features include grooves, pyramidal structures, prismatic features, domes, ridges, hemispherical features, axially-symmetric cubic profile features, and the like, as will be readily understood by one of skill in the art. More generally, a non-planar interface is one in which most of the planes tangent to individual points along the interface is not parallel to the primary plane passing between the layers that form the interface. A non-planar interface or surface may have planar regions that do not have a significant number of topographical features, but the interface or surface as a whole still may be considered to be non-planar as disclosed herein. Since planar interfaces and surfaces in an OLED may not be perfectly smooth, it may be desirable to distinguish between an interface having such relatively small imperfections, which would otherwise be planar, and an intentionally non-planar interface as disclosed herein. Thus, imperfections and topographical features less than 100 nm in height generally are not considered when determining whether an interface is planar or non-planar. That is, a planar interface or surface may include imperfections or other topographical features of up to 100 nm without being considered a non-planar interface as disclosed herein.

In some configurations, the internal extraction layer may be formed from, or include the same material as the substrate. For example, the internal extraction layer 701 and the substrate 740 may be formed of a single material, and may be formed as a continuous region of that material. Thus, a portion of the material adjacent to the electrode 730 (for example, above the dotted line in FIG. 7) may form the internal extraction layer, while the remaining portion of the material (below the dotted line) may form the substrate. In other configurations, the internal extraction layer may include one or more materials that are different than the material of the substrate. In configurations in which the internal extraction layer does not include the substrate material, it may be preferred for at least one material in the internal extraction layer to have an index of refraction that is between the refractive indices of the electrode and the substrate. More generally, the internal extraction layer may include multiple materials, each of which may have a different refractive index. It may be preferable for the internal extraction layer to include at least one material having a refractive index of not less than 1.7, 1.8, or 1.9. In some configurations the refractive index of the internal extraction layer material also may be higher than the refractive index of an emissive layer of the device. For example, the material in the internal extraction layer may have a refractive index at least 0.005 higher than that of an emissive material in the device.

Figure 7A:
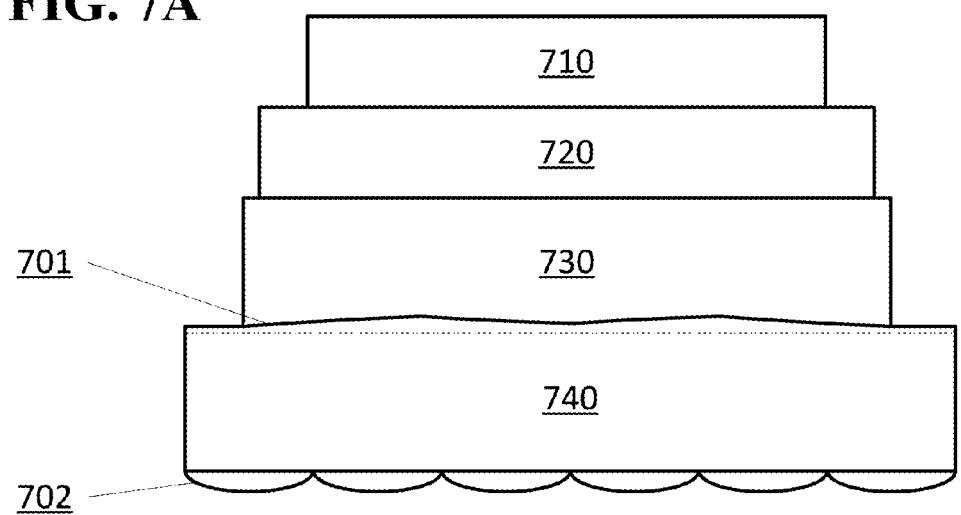
FIG. 7A shows a schematic representation of an OLED incorporating extraction layers as disclosed herein.
Figure 7B:
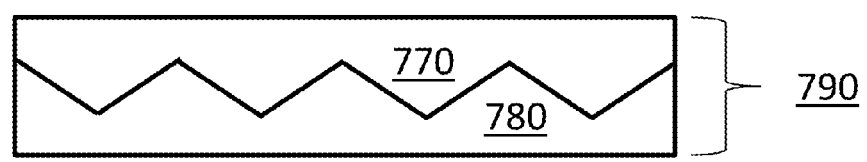
FIG. 7B shows a schematic representation of an internal extraction layer as disclosed herein.

More generally, an internal extraction layer may be defined by a region of a device that includes a relatively high index material and a lower index material having a refractive index lower than that of the high index material, with a non-planar interface between the high and low index materials. In a device, the low index material is disposed adjacent to the substrate, and may be the same material as the substrate. As previously described, the low index material and the substrate also may be a continuous material region, i.e., may be fabricated as a single layer or structure. FIG. 7B shows a schematic representation of an internal extraction layer 790. The layer may include a high index material 770 and a low index material 760 disposed adjacent to one another, with a non-planar interface between them. The low index material 760 may be the same material as an OLED substrate and/or the low index region may be an integral part of a substrate of an OLED device. The specific configurations of non-planar interfaces shown in FIGS. 7A-7B are provided as illustrative only, and it will be understood that other types and arrangements of non-planar layers may be used.

In general, any substrate suitable for use with OLEDs may be used with the embodiments disclosed herein. In some configurations, it may be preferable for the substrate to have a refractive index of at least 1.65 to improve index match with the other layers and structures disclosed herein, and thereby increase the outcoupling of light generated by the device.

As previously described, an internal extraction layer as disclosed herein may include a non-planar interface, and may include multiple materials. In the example shown in FIG. 7A, the non-planar interface is between the internal extraction layer and the substrate. Alternatively or in addition, the internal extraction layer may include a non-planar interface between two materials in the internal extraction layer. For example, the non-planar interface may be between a material that is the same as, or has a refractive index matched to, the substrate, and a second material in the internal extraction layer.

In some embodiments disclosed herein, an external extraction layer may be disposed on the outer surface of the substrate relative to the internal extraction layer, i.e., the substrate may be disposed between the internal and external extraction layers. FIG. 7A shows a schematic example of a device having an external extraction layer 702 disposed adjacent to the outer surface of the substrate 740. The external extraction layer may include a non-planar surface as previously described, such as the outer-most surface farthest away from the substrate. The external extraction layer surface may include topographical features such as microlenses, grooves, pyramidal features, prismatic features, and other topographical features known in the art. As previously described with respect to the internal extract layer, the external extraction layer may be partially or entirely formed from the same material as the substrate, and may be continuous with the substrate.

Various configurations may be used for the internal and external extraction layers. For example, the external extraction layer may include an arrangement of microlenses, as shown in FIG. 7A. In some configurations, specific dimensions or relative dimensions may be used for one or more of the microlenses.

Figure 8:
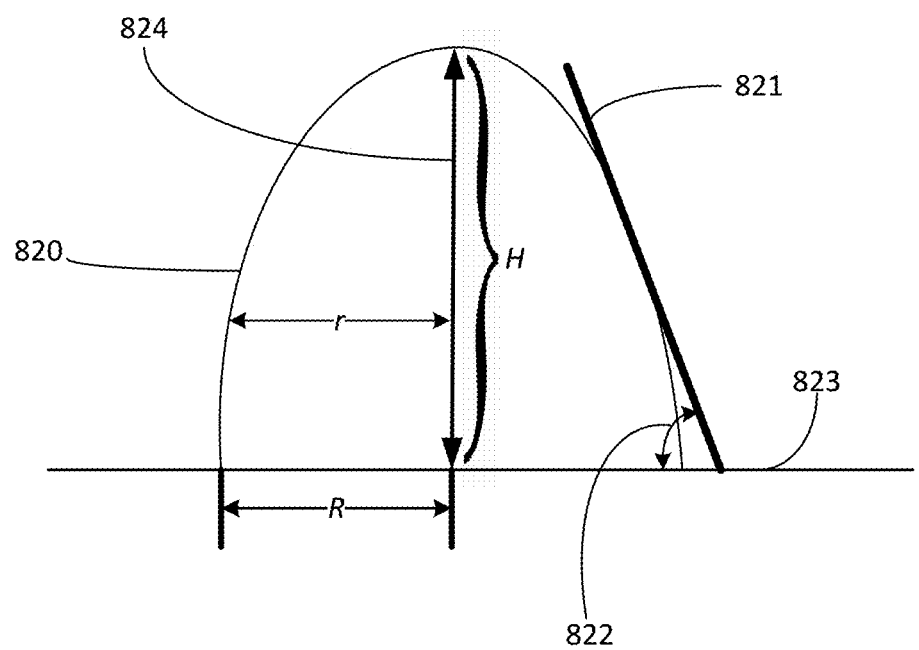
FIG. 8 shows an example microlens as disclosed herein.

FIG. 8 shows an example of a microlens configuration suitable for use with embodiments disclosed herein. Each point on a surface of the microlens has a tangent plane, such as 821, that forms an interior angle 822 of not more than, or less than 90 degrees with an interface 823 of the outcoupling layer and the organic light emitting device. The microlens 320 nay have a lens height H and a largest base measurement 2R. The largest base measurement 2R of a microlens is the diameter of the microlens. In some embodiments, H/R may be greater than 1, greater than 1.5, or at least 2. Ray tracing simulations demonstrate that significantly more efficient outcoupling can be obtained for parabolic and cubic microlenses than spherical microlenses. Spherical microlenses exhibit optimal outcoupling when H/R=1. For H/R<1 outcoupling from parabolic or cubic microlens arrays is inferior to spherical microlenses. However, for H/R>1, improved outcoupling can be obtained for parabolic and cubic arrays than that obtained for spherical arrays at H/R=1.

The base of a microlens may be of any shape such as circular, rectangular, square, triangular, elliptical, octagonal, hexagonal, etc. For example, as shown in FIG. 8, the base of a microlens may be circular, in which case, the base measurement R is a radius. For example, each microlens may be radially symmetric about an axis 824 of the microlens that is normal to the interface 823 of the outcoupling layer with the organic light emitting device.

More generally, microlenses as disclosed herein may be radially symmetric, as shown in FIG. 3B. Each such microlens has a thickness profile defined by a continuous function in r, wherein r is the distance from an axis 824 of the microlens 820 centered on the base of the microlens 820 and normal to the interface 823 of the outcoupling layer with the organic light emitting device. As shown, r is less than or equal to R. The thickness profile of the microlenses can be given by equation 10.1, 10.2 or 10.3, or, more generally, equation 10.4, shown below, where $r^2=(x-x_c)^2+(y-y_c)^2$. Equation 10.1 yields microlenses with a parabolic shape, equation 10.2 is a quadratic polynomial and describes microlenses with constant curvature, which are referred to as spherical. Microlenses obeying equation 10.3 are referred to as cubic.

$$\frac{1}{R_1^2}(x-x_c)^2 + \frac{1}{R_2^2}(y-y_c)^2 + \frac{1}{H^n}z - 1 = 0 \qquad 10.1$$

$$\frac{1}{R_1^2}(x-x_c)^2 + \frac{1}{R_2^2}(y-y_c)^2 + \frac{1}{H^2}z^2 - 1 = 0 \qquad 10.2$$

$$\frac{1}{R_1^2}(x-x_c)^2 + \frac{1}{R_2^2}(y-y_c)^2 + \frac{1}{H^3}z^3 - 1 = 0 \qquad 10.3$$

$$\frac{1}{R_1^2}(x-x_c)^2 + \frac{1}{R_2^2}(y-y_c)^2 + \frac{1}{H^n}z^n - 1 = 0 \qquad 10.4$$

$$n \geq 1$$

Figure 9A:
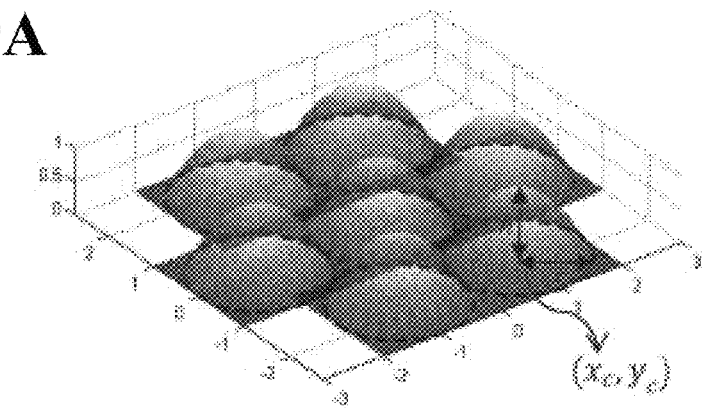
FIGS. 9A-C show example microlens arrays as disclosed herein.
Figure 9B:
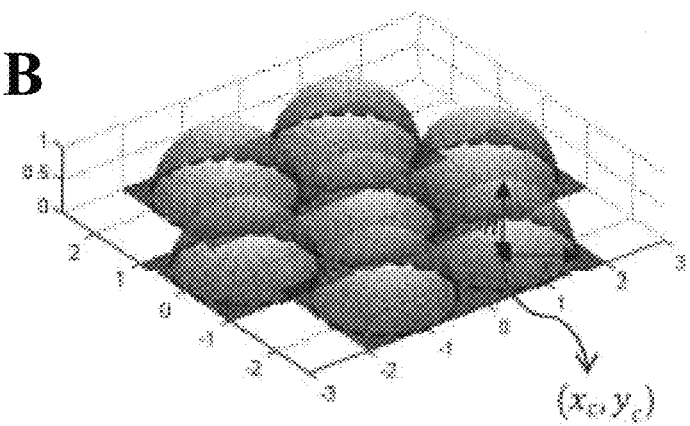
Figure 9C:
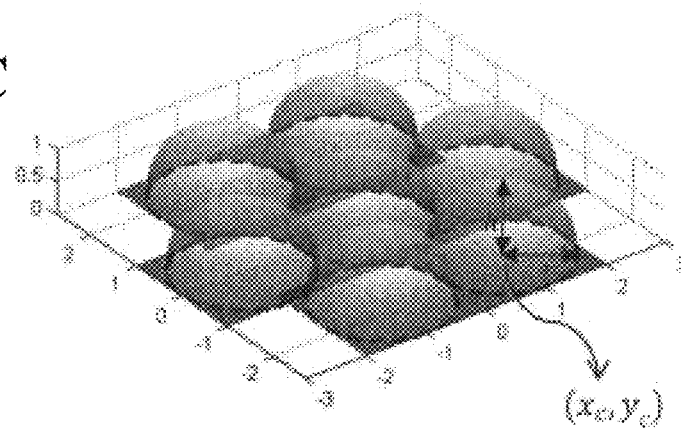

FIGS. 9A-9C show a microlens array with parabolic surfaces as defined by equation 10.1, spherical surfaces as in equation 10.2, and cubic surfaces as in equation 10.3, respectively. The coordinate system is illustrated in FIGS. 9A-C. Each of the microlenses is centered around its own origin $(x_c, y_c)$. According to an embodiment, the emissive (top) side of an OLED substrate is patterned with an array of microlenses as shown in FIGS. 9A-C. Coordinates x and y are in plane, and z is out of plane. Each microlens in the array has a symmetry axis running through a separate $x_c$ and $y_c$.

Figure 10A:
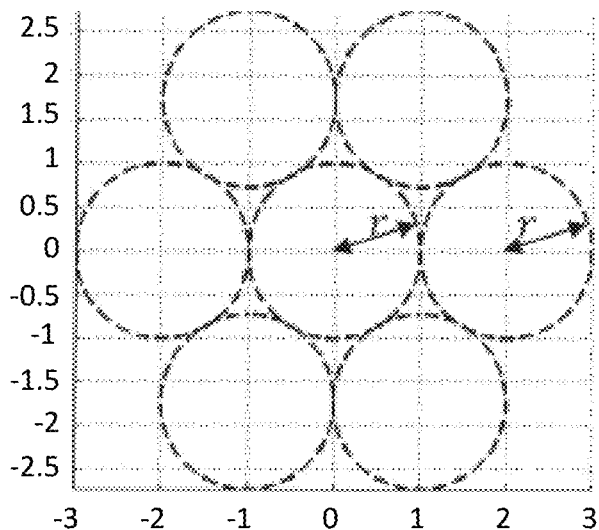
FIG. 10A shows an example hexagonal close packed array of microlenses as disclosed herein.
Figure 10B:
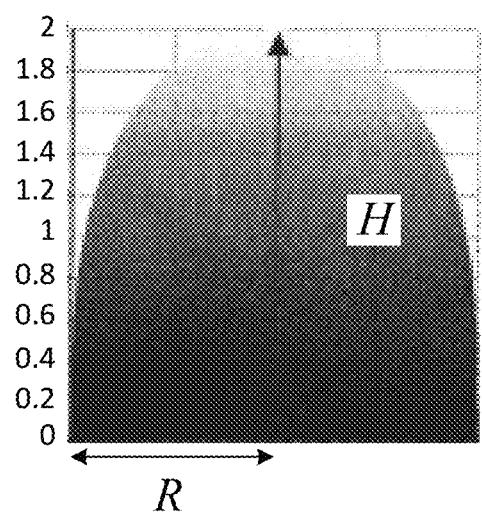
FIG. 10B shows a radial cross section of a microlens as disclosed herein.

In an embodiment, the multiple microlenses are closely packed. In general, close-packing of microlenses is a dense arrangement of microlenses in a regular arrangement (or lattice), typically in a repeating pattern. Closely packed refers to the most tightly packed or space-efficient composition of microlenses structures (lattices) that's allowed by manufacturing techniques. For example, for a hemisphere microlens system, the neighboring base circles are tangential to each other. In general, this will be limited by the manufacturing techniques being used. FIG. 10A shows a hexagonal close packed array of microlenses and FIG. 10B shows a radial cross section of a microlens. The arrangement of microlenses in FIG. 10A is an optimally packed array of single sized lenses. The microlens radius R and height H are shown in FIG. 10B and the thickness profile of this microlens obeys equation 10.3 shown above.

Figure 11A:
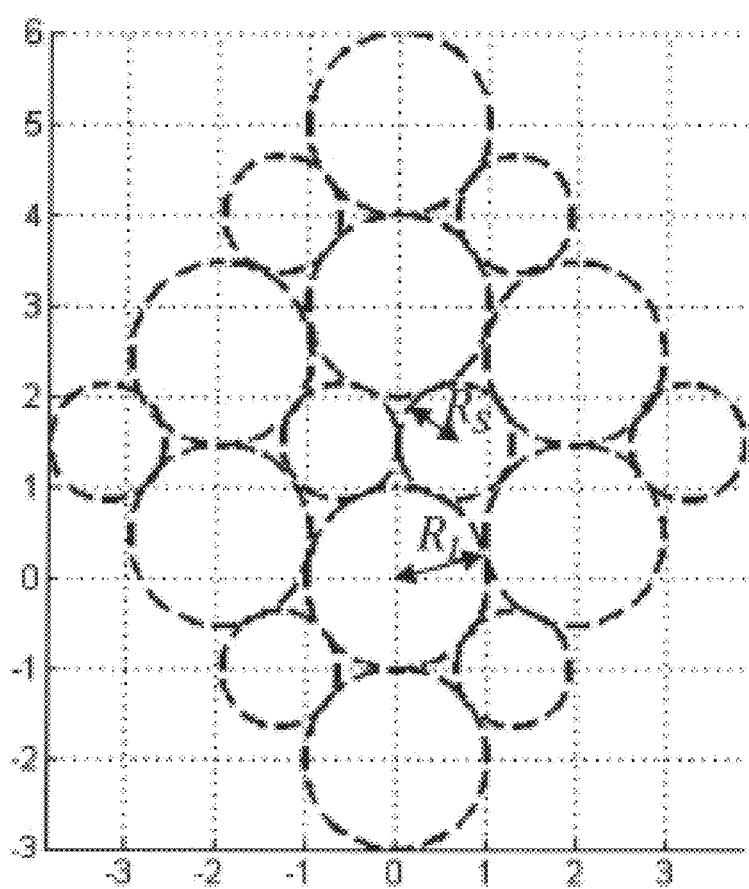
FIG. 11A shows an example microlens array incorporating two different sizes of microlenses as disclosed herein.
Figure 11B:
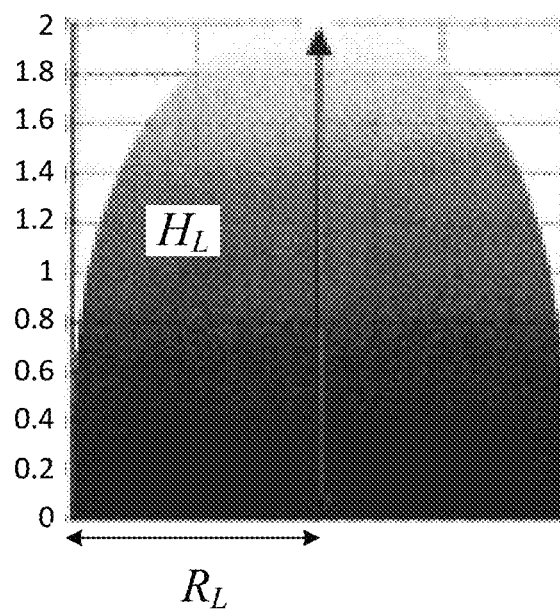
FIG. 11B shows a radial cross section of each size of microlens shown in FIG. 11A.
Figure 11B:
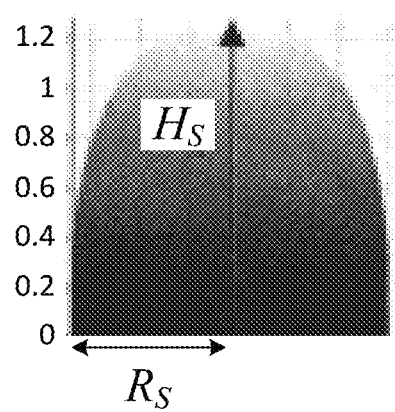

Using microlenses with more than 2 different sizes can further improve the fill factor of microlens, and thus improve light extraction. In particular, packing of microlenses can be improved by incorporating microlenses of multiple different sizes into the array as shown in FIGS. 11A and 11B. This improved packing increases the fill factor of the microlens array, leading to an overall improvement in outcoupling. FIG. 11A shows an array incorporating two different sizes of microlenses for optimal area coverage and FIG. 11B shows a radial cross section of the two different sized microlenses. The large lens radius $R_L$ and height $H_L$, and the small lens radius $R_S$ and height $H_S$ are shown in FIG. 11B. The thickness profile of the microlenses obey equation 10.3 above. As an example, the dimensions of the smaller microlenses are 0.6376× that of the larger lenses, although other varying dimensions of microlenses may be used. This improved packing increases the fill factor of the microlens array, leading to an overall improvement in outcoupling. According to an embodiment, at least one microlens of the multiple microlenses has a base measurement $R_1$ and at least one microlens of the multiple microlenses has a base measurement $R_2$, and $R_1$ is different from $R_2$. In the embodiment in which the base measurement R is a radius, at least one microlens of the multiple microlenses has a radius $R_1$ and at least one microlens of the multiple microlenses has a radius $R_2$, and $R_1$ is different from $R_2$. In one embodiment, the multiple microlenses are arranged in a geometrically repeating pattern, for example as shown in FIG. 11A. In an embodiment, the device has a fill factor defined by the fraction of a surface of the light emitting device covered by the multiple microlenses, and the fill factor, i.e., the fraction of the surface of the device covered by microlenses, is greater than about 85%, and at least about 90%.

FIG. 12 shows an example of rays propagating from an array of microlenses. When a ray approaches the surface of a microlens, it can refract and pass from the substrate to air or it can reflect back into the substrate. These outcomes are governed by Fresnel's equations. Occasionally a ray that is outcoupled from one lens can intersect a neighboring lens and incouple back into the substrate. FIG. 12 shows points of interaction between rays and the substrate as marked with dots. According to the present disclosure, outcoupling can be further enhanced by using a high index substrate to avoid loss of light between the device and substrate. Microlenses help to mitigate the outcoupling loss at the substrate/air interface to allow for a net improvement ire outcoupling. In an embodiment, the multiple microlenses are comprised of a material having an index of refraction X, and a layer of the organic light emitting device adjacent to the outcoupling layer is comprised of a material having an index of refraction Y. In this case, the difference between X and Y is less than about 0.1.

As previously described, a layer of the organic light emitting device adjacent to the external extraction layer includes a material having an index of refraction of at least about 1.7. In an embodiment, the external extraction layer may be made of a single material. In some cases, the external extraction layer is part of a transparent polymer substrate. In some cases, the transparent polymer substrate is flexible. In a embodiment, the multiple microlenses include a first material and a portion of the external extraction layer adjacent to the organic light emitting, device may include a second material, as previously described. The microlenses may be have an index of refraction greater than about 1.5, greater than about 1.6, or greater than about 1.7.

According to an embodiment, microlens arrays can be fabricated by stamping, in which material is laid down onto a substrate in a pattern. Microlens arrays can be fabricated by embossing, in which material that is already present on the substrate is formed into a desired surface shape using a mold. An array of stamped aspherical microlenses will generally require a post-stamping step to form the deposited spots of microlens polymer into the desired shape. Electrostatic stretching of an array of UV curable polymer microlenses, as demonstrated by Kuo et al. 2010 is an example of such an approach. Stamped polymers generally must be curable and there are relatively few such high index polymers on the market. UV curable polymers with refractive indices of n greater than 1.6 are available (Morford et al., Press-patterned UV-curable High Refractive Index Coatings, Society of Photo-Optical Instrumentation Engineers, pp 612301-612301-11 (2006)).

While the embossing process may seem to be conceptually simple, some care must be taken to generate a metal mold with the appropriate microstructure. Once a master with the appropriate microstructure has been generated, a metal mold can be fabricated by electroforming over the master using the lithography-electroforming-molding (LIGA) process (Becker et al., Fabrication of Microstructures with High Aspect Ratios and Great Structural Heights by Synchrotron Radiation Lithography, Galvanoforming, and Plastic Moulding (LIGA Process), Microelectronic Engineering 4 (1986) 35-56). An aspheric lens master can be fabricated using a process such as the polymer stamping and electrostatic stretching process described earlier. It should be noted that although a master must have the correct shape, its optical properties are irrelevant. The master can be stamped onto a conductive substrate to be compatible with the LIGA process. When immersed in a metal plating bath, metal accumulates on the master to form a mold. Regions occupied by polymer leave voids after the process is complete. The mold is then ready to use after appropriate finishing steps.

According to an embodiment, the multiple microlenses are embossed into the substrate, such as a polymer substrate. Embossing often refers to another plastic technique which involves forming a layer of uncured polymer pre-coated onto a more robust polymer substrate. This facilitates the formation of a master. Since metal is not required, a mold can be cast directly from the master made from curable polymer (Liu et al. 2010). Similarly a roller coated with a cured plastic mold can be used to emboss substrates after it has, itself been embossed using a master. It may be possible to adapt production of aspheric microlenses from curable polymer to roll-to-roll processing using technology described in U.S. Pat. No. 8,257,793 B2 (Forrest 2010).

According to an embodiment of the disclosed subject matter, a method of fabricating an emissive device is provided. The method includes fabricating an outcoupling layer that includes multiple microlenses on a first surface of a substrate. For each microlens among the multiple microlenses, each point on a surface of the microlens has a tangent plane that forms an interior angle of not more than 90 degrees with an interface of the outcoupling layer and the substrate. Additionally, each microlens among the multiple microlenses has a lens height H and a largest base measurement 2R, where H/R is greater than 1. The method may further include obtaining an organic light emitting device, and disposing the organic light emitting device on a second surface of the substrate opposite the first surface. For example, the method of fabricating an emissive device may include fabricating an outcoupling layer that includes multiple microlenses on a first surface of a substrate prior to depositing an OLED on a second surface of the substrate, where the second surface is opposite the first surface. In one embodiment, the multiple microlenses are embossed into the substrate. According to an embodiment, the multiple microlenses may be formed by a subtractive process or by an additive process.

As described in further detail with respect to several example configurations for which light extraction was calculated, light outcoupling from an OLED may be significantly enhanced relative to a conventional OLED when an internal extraction layer is used in conjunction with an external extraction layer.

Figure 23:
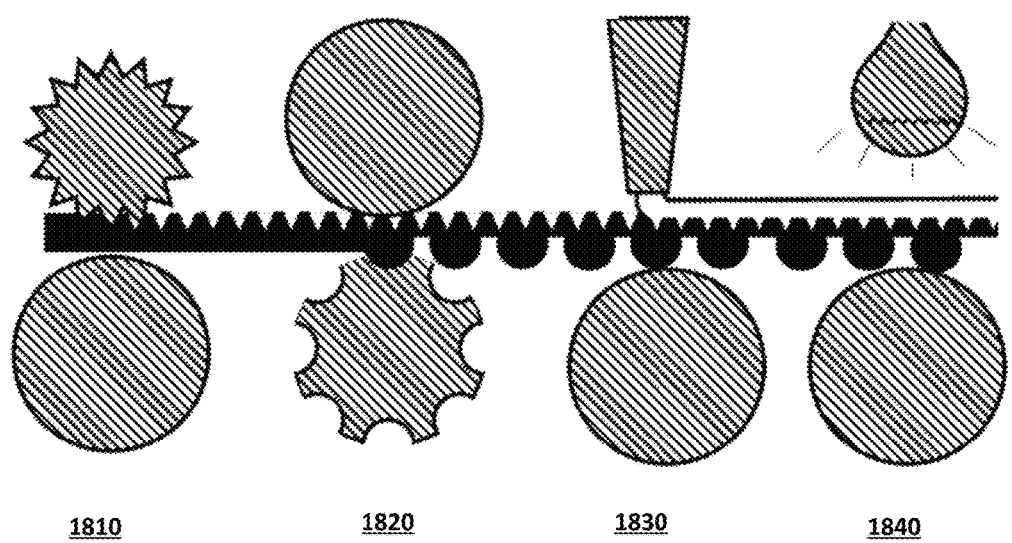
FIG. 23 shows an example roll-to-roll processes for fabricating a device as disclosed herein.

Devices and structures disclosed herein may be fabricated using a range of techniques. For example, the structure discussed herein can be made from a combination of thermoplastic and thermoset materials, and may be fabricated using a roll to roll process such as shown in FIG. 23. The negative forms of the IEL features may be fabricated, such as via roller embossing, onto one surface of a hot thermoset plastic sheet at 1810. This sheet effectively becomes the mold for a high-index thermoset material to be dispensed later. The refractive structures of the EEL may be roller embossed into the opposite surface of the sheet at this stage 1820. The embossed sheet then runs through cooling rollers. After cooling, a liquid high-index thermoset material that acts as both a planarization layer and an IEL is dispensed onto the sheet at 1830. Other coating techniques, such as slot coating, also may be used. The material is then exposed to the appropriate initiator, such as ultraviolet light, to cure the planarization layer at 1840. A thin film of material such as $Si_3N_4$ can be optionally deposited between 1820 and 1830, or after 1840 to improve the barrier properties of the substrate.

After application of the planarization and internal extraction layer, the substrate is prepared as necessary for deposition of an electrode. This may be, for example, a transparent conducting oxide anode deposited by plasma sputtering. It can be patterned using either a shadow mask during deposition or photolithographic methods afterward. An OLED and top electrode can then deposited over the substrate using standard methods such as vacuum thermal evaporation. The OLED may be encapsulated to resist oxygen or moisture.

Although a roll-to-roll process is shown and described using specific examples of fabrication techniques, it will be understood that more generally any suitable technique known in the art may be used to fabricate the structures disclosed herein. More specifically, any technique suitable for fabricating a non-planar layer and/or topographical features may be used to fabricate the internal and external extraction layer structures disclosed herein.

EXPERIMENTAL

Thin film layers were modeled using Berreman's Matrix Method, and the generated light intensity profile was used as an input to a Monte Carlo ray tracing model. The interfaces between the IEL and substrate, and between the EEL and air were modeled separately. In accordance with the structures and devices previously described, the light distribution output of the IEL model was used as the input of the EEL.

The angular distribution of light reflected from the EEL back onto the IEL and thin film layers was determined by ray tracing the effect of each interface individually. Reflected light then proceeds outward from the device in a second pass. It was found that the emission contribution from light reflected back onto the device is only 10% of the total light emitted, so the contribution of second and higher order reflections is negligible.

The IEL was modeled as including a layer of transparent, high refractive index material (n of 2.0 or more) between a transparent oxide anode (n=1.9) and the substrate (n=1.5-1.7). Because the IEL has higher refractive index than the anode, it extracts nearly all light incident upon it. The modeled thickness of the IEL was significantly greater than the wavelength of outcoupled light in the model, so the IEL successfully inhibited the formation of waveguided modes within the OLED and its anode.

The index of the IEL was chosen so that light is refracted towards normal direction as it enters the IEL. The intensity of light emission as a function of angle with respect to normal is shown in FIG. 13. Light emission has uniform intensity with respect to angle in the organic layers (EM) where it is generated. The indium tin oxide transparent conducting electrode (ITO) has a higher index of refraction than most organic materials, i.e., n=1.93 vs. n=1.85 for common organics. Light rays passing from the organic layers to the transparent conducting electrode are, therefore, refracted to trajectories within 73° of the normal vector. A light intensity peak at 73° within the electrode results from the concentration of light rays on far off-normal trajectories. When light enters the internal extraction layer (IEL) from the transparent conducting electrode, it is again refracted towards the normal and the intensity peak moves inward. The intensity peak occurs 68° for an IEL with index of refraction n=2.0. Refracting light towards the normal makes it easier to outcouple with topographical features on the EEL to air interface. Collecting and outcoupling light rays that begin on far off-normal trajectories is critical for an effective outcoupling aid, since most of the light emitted by a light source with uniform angular distribution travels close to the plane of the substrate. Increments of azimuth, $d\theta$, close to the equator of a unit sphere subtend a larger solid angle, $d\Omega 2=\pi \sin(\theta)d\theta$, than increments closer to the poles.

As previously described, the interface between an internal extraction layer and a substrate may be patterned with topgraphical features to refract light as it passes between the two structures, thereby allowing light that would not otherwise pass from the electrode to the substrate to be outcoupled.

Figure 16:
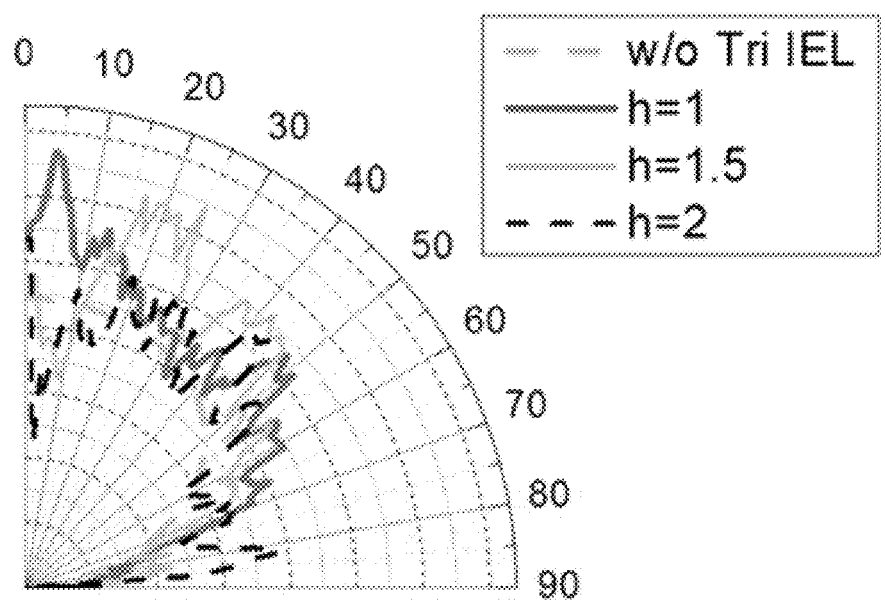
FIG. 16 shows a polar plot of intensity for light outcoupled to the substrate by an extraction layer structure as disclosed herein.

The outcoupling performance of a set of triangular ridges was studied as a function of aspect ratio h/a where h is the height of the ridge and 2a is its width. FIG. 14 shows an example of a series of such topographical features. The results of the ray tracing simulations are plotted in FIG. 15. The data points show the fraction, as a function of aspect ratio, of initially generated light that is transmitted to the substrate by an IEL that includes triangular ridge topographical features. The baseline case of 44% outcoupling to glass for h/a=0 corresponds to the glass result shown in FIG. 4. It was found that approximately 50% of generated light was outcoupled when h/a=1.5. Tall features, such that h/a>1, couple light from the IEL to the substrate most efficiently since they redirect light moving near the plane of the substrate towards the normal direction. The angular profile of light emitted into the substrate is given in FIG. 16.

Figure 17:
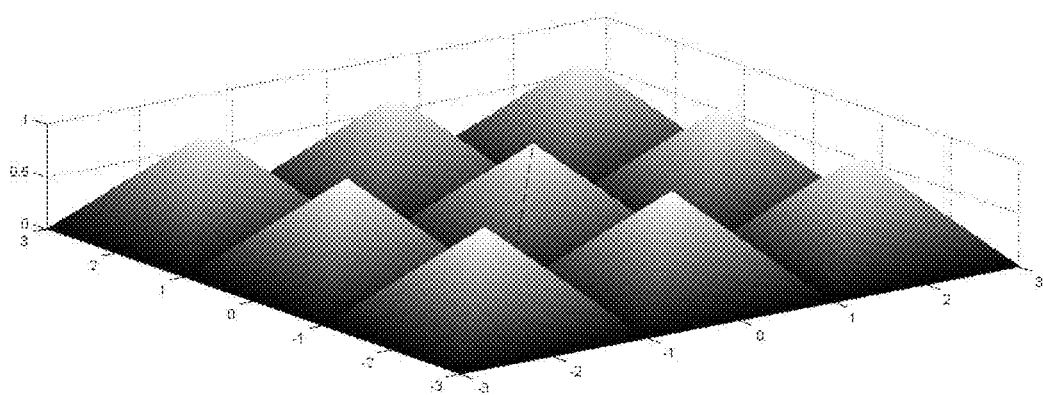
FIG. 17 shows the topography of a pyramidal extraction layer as disclosed herein.

It was further found that a pyramidal interface, as depicted in FIG. 17, may be more effective than triangular ridges due to its two dimensional character. Such a structure was found to increase the outcoupling efficiency of the example OLED from 25% to 44% when used with an appropriate external extraction layer. Likewise, an IEL of hexagonal array of close packed hemispherical microlenses can increase outcoupling efficiency to 45%.

In general, a mixture of horizontal and vertical surfaces does not outcouple light more effectively than an interface composed of oblique or curved surfaces. Likewise, interfacial features with significant horizontal surfaces are less effective outcouplers than those that do not. For example, frustrated pyramids do not outcouple light as efficiently as pointed pyramids.

It was found that an efficient IEL alone generally does not eliminate the need for a high refractive index substrate. A high index substrate, for example with n=1.7, is believed to be necessary to maximize the amount of light collected from the IEL. Furthermore, a high index IEL, for example n=2.0, provides an interface between the IEL and substrate that is sufficiently refractive to redirect light rays moving close to the substrate plane to the normal direction. It was found that other structures, such as substrates with n=1.5 or IELs with n=1.7 or 1.9, generally may not be as effective at outcoupling a majority of light from the device.

Figure 18:
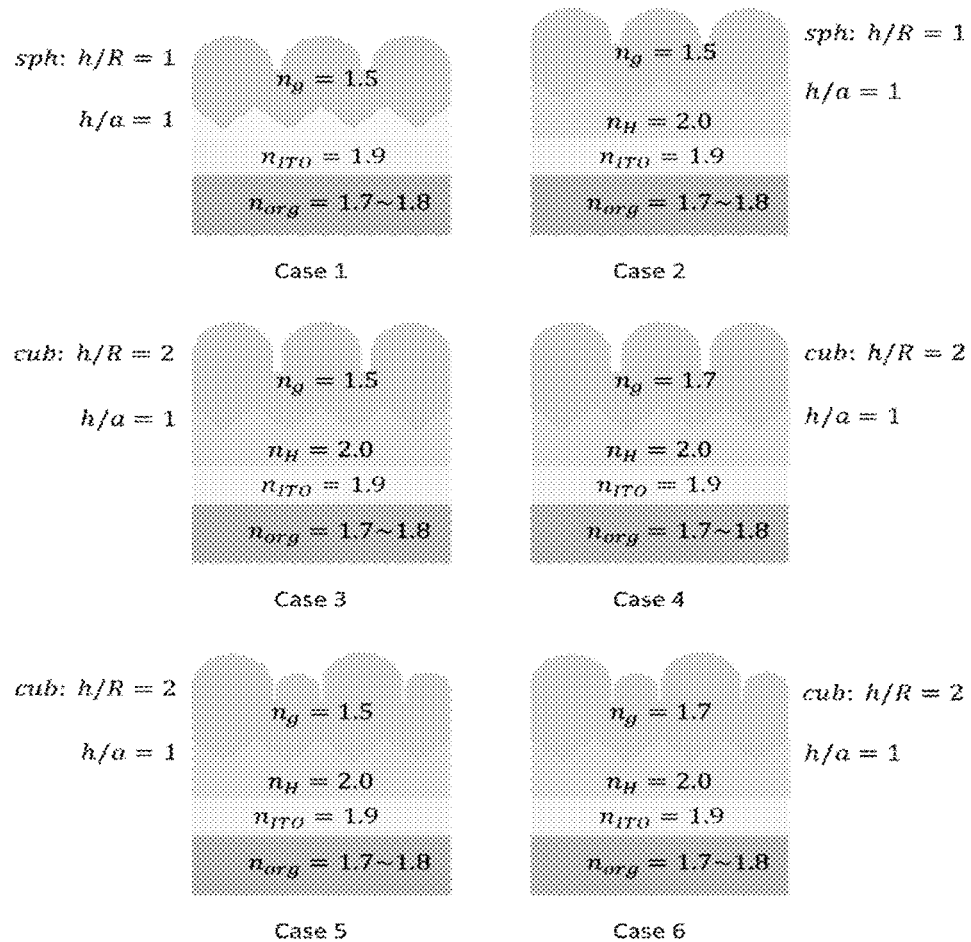
FIG. 18 shows schematic diagrams of OLEDs featuring extraction layer combinations as disclosed herein.
Figure 19:
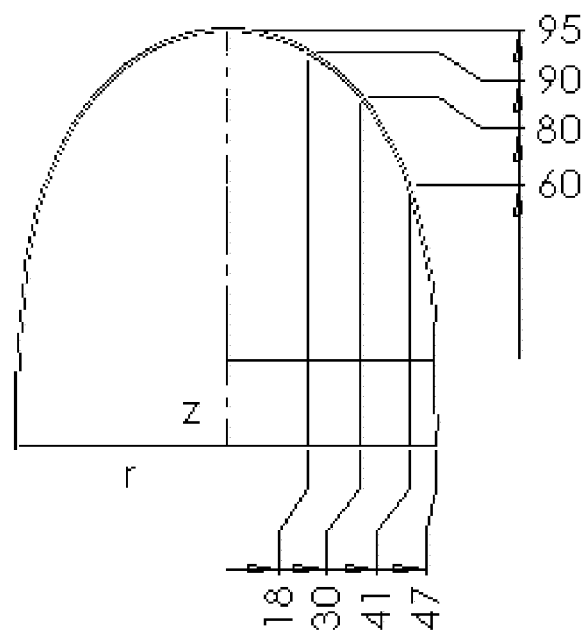
FIG. 19 shows an example profile of a cubic aspheric microlens as disclosed herein.
Figure 20:
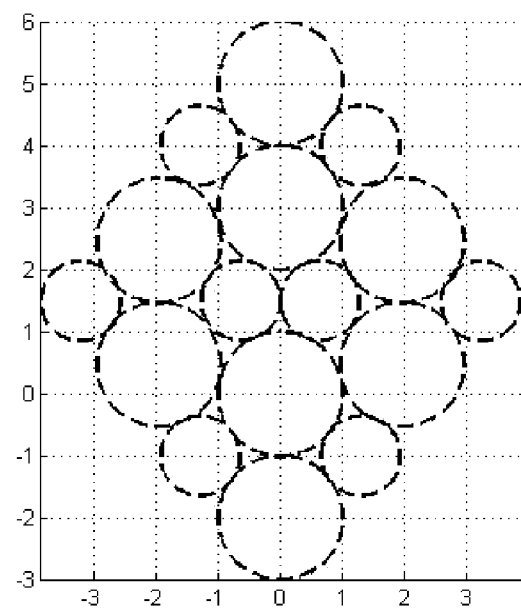
FIG. 20 shows an example of an extraction layer packing pattern incorporating two different sizes of microlenses as disclosed herein.
Figure 21:
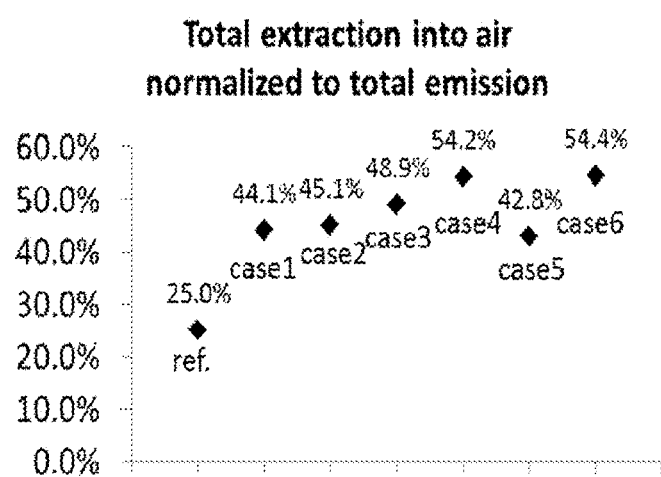
FIG. 21 shows the calculated outcoupling efficiencies for devices having the structures as shown in FIG. 18.
Figure 22:
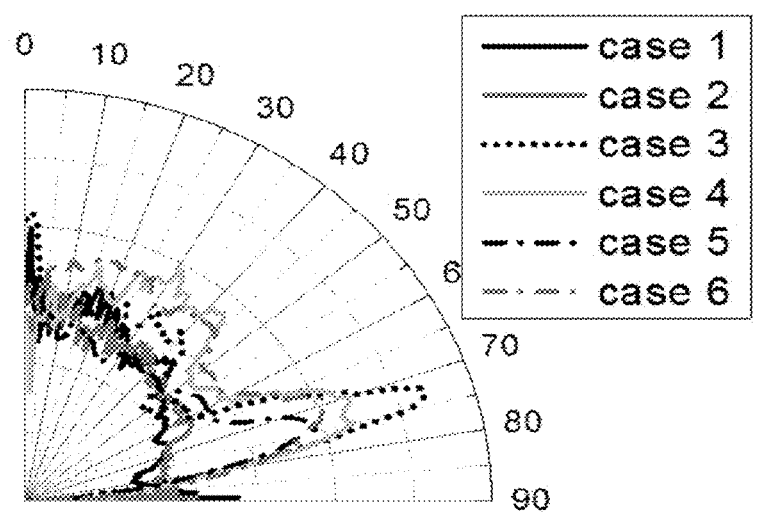
FIG. 22 shows a polar plot of emission intensity generated by devices having the structures shown in FIG. 18.

A variety of EELs were also simulated in combination with a pyramidal IEL with h/a=1. These combinations appear diagrammatically in FIG. 18. As shown, the simulated structured included hexagonally-packed arrays of hemispherical microlenses on low index n=1.5 substrates. The IEL was simulated as being either index matched to the anode (case 1), or with n=2.0 (case 2). The EEL was modeled as featuring a hexagonal array of high aspect ratio cubic profile lenses (case 3). These lenses have an aspect ratio of h/r=2, where h is height and r is radius. It was found that using a high-index substrate n=1.7 with the cubic lens (case 4) may improve outcoupling from 48.9% to 54.2%. As previously described, cubic or other microlenses can also be packed in a tessellating pattern of large and small lenses to increase the fraction of substrate surface area covered by a lens, or in any other suitable close-packed arrangement. An example of an axially symmetric cubic lens profile is shown in FIG. 19, and an example of a tessellating packing pattern is provided in FIG. 20. It was found that such a configuration does not improve outcoupling for a low index substrate (case 5), but that it provides an improvement in the case of a high index substrate (case 6). Thus, the outcoupling efficiency of an OLED can be increased from 25% (typical for a standard OLED), to 54.4% by using the selected outcoupling features illustrated in case 6. The calculated outcoupling efficiencies for the six cases illustrated in FIG. 18 are shown in FIG. 21, and FIG. 22 provides a luminaire plot showing the distribution of light produced by each case.

Figure 24A:
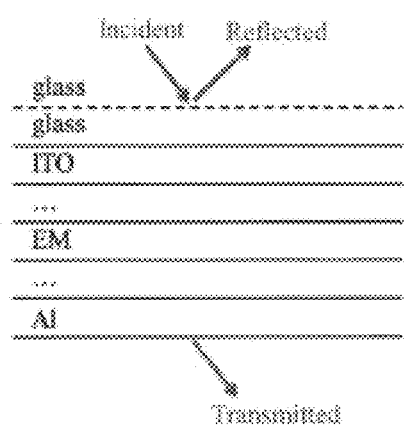
FIGS. 24A and 24B show use of Berrman's method to handle reflections from the microlens array to air interface onto the OLED structure as disclosed herein.
Figure 24B:
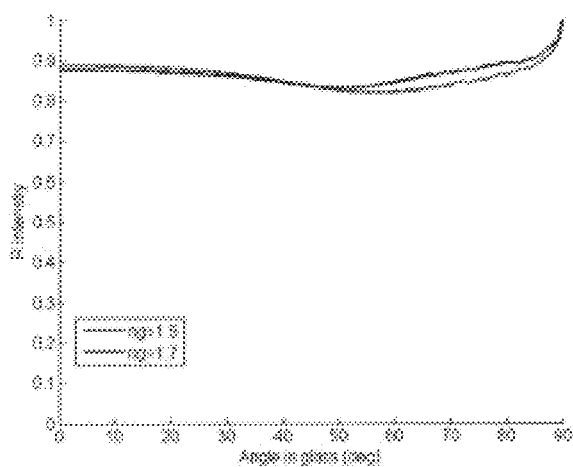

FIGS. 24A and 24B further show Berreman's method used to model reflections from a microlens array to air interface for an external extraction layer as disclosed herein. FIG. 24A shows a stack of thin films for an OLED grown on the reverse of a glass substrate. This film includes an indium tin oxide (ITO) anode, the emissive layer of the OLED (EM) and the aluminum (Al) cathode. FIG. 24A also shows incident, reflected, and transmitted light rays. FIG. 24B shows the fraction of light reflected from the layered structure of FIG. 24A as a function of incident angle. Light that is not reflected is generally lost due to absorption at the aluminum cathode. Light that is reflected by the OLED structure has a second opportunity to be outcoupled to air through the microlens array. Therefore a highly reflective OLED structure generally may improve outcoupling efficiency.

Figure 25A:
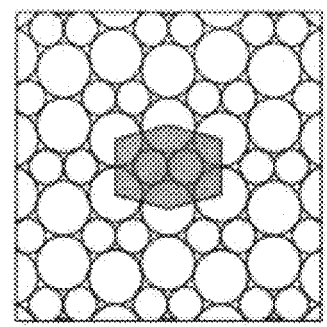
FIGS. 25A and 25B show an example of the domain over which the ray tracing model simulates outcoupling from microlens structures as disclosed herein.
Figure 25B:
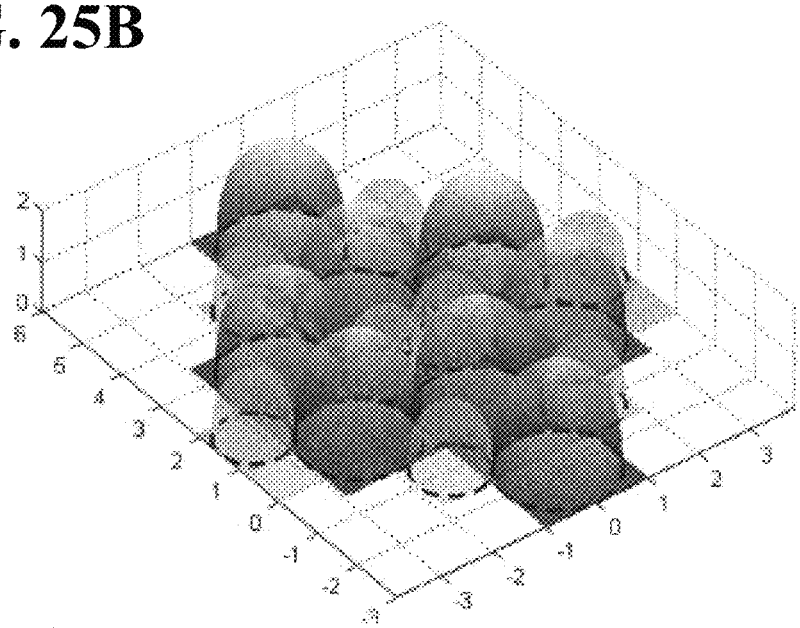

A multiple length-scale model was used to estimate the amount of light various microlens architectures could outcouple to air. Berreman's method was first used to handle thin film optical effects in the OLED structure and determine the angular distribution of light entering the substrate. Both forward and backward propagating light from the emissive layer was considered when solving for the distribution of light into the substrate. Light generated by the OLED was assumed to have random polarization. The results of Berreman's method were used to generate an angular distribution of rays propagating through the substrate using a Monte-Carlo ray tracing algorithm. Rays were introduced at random points beneath a repeating unit of the specific microlens array architectures under study. An example of such a repeating unit, that forms the domain of the ray trace simulation, is shown in FIGS. 25A and 25B. FIG. 25A shows a view normal to the plane of the substrate. The microlens pattern is broken into periodic repeating cells such as the shaded region and a single cell is chosen as the domain of the simulation. FIG. 25B shows the topography of the microlenses in such a cell. In this case, the cell contains a pattern of two differently sized microlenses. Interactions between rays of light and the curved surfaces of the microlens array were governed by the Fresnel equations. Transmission and reflection coefficients were calculated as an average of $\sigma$ and $\pi$ polarization cases, which depend only on the angle of incident light ray with respect to the normal of plane tangent to the surface where a ray intersects. Light rays in model were allowed to reflect between lens surfaces up to 30 times before leaving the simulation. Rays that reflect once off of the OLED structure after failing to outcouple to air on their first pass through the substrate are also considered. An example of rays tracing through a simulated microlens array is shown in FIG. 12. Simulation results are expressed by integrating the strength of light emitted into the air by the substrate, including both the curved microlenses and flat areas between them, and comparing that value to the light introduced at the emissive layer.

Berreman's method was also used to compute the direction and strength of reflection off of the OLED layers for rays of light that do not leave the substrate on its first pass due to reflection off of the microlenses. The structure had a reflectivity of between 0.8 and 0.9 depending incident angle. The modeled structure and the reflectivity of the OLED structure as a function of incident angle are given in FIGS. 24A and 24B. Light that is not reflected is generally lost due to absorption at the aluminum cathode. Light that is reflected by the OLED structure has a second opportunity to be outcoupled to air through the microlens array. Therefore a highly reflective OLED structure improves outcoupling efficiency.

Figure 26A:
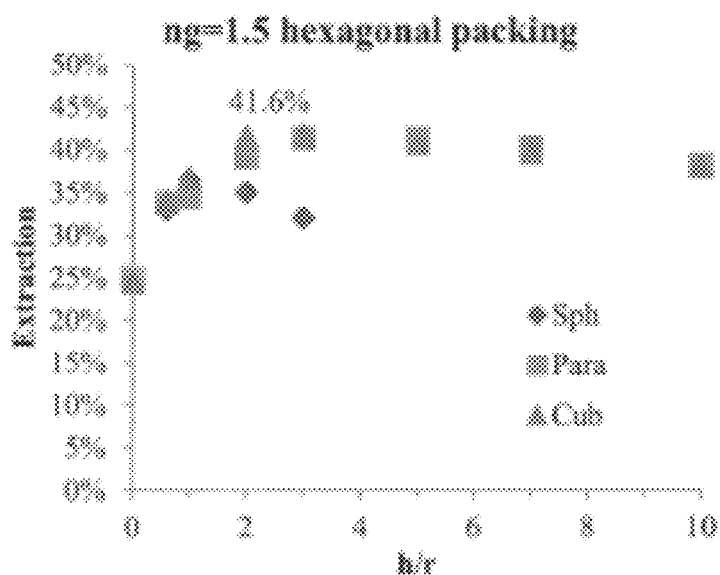
FIGS. 26A and 26B show the integrated light extraction of hexagonal close packed microlens arrays as disclosed herein.
Figure 26B:
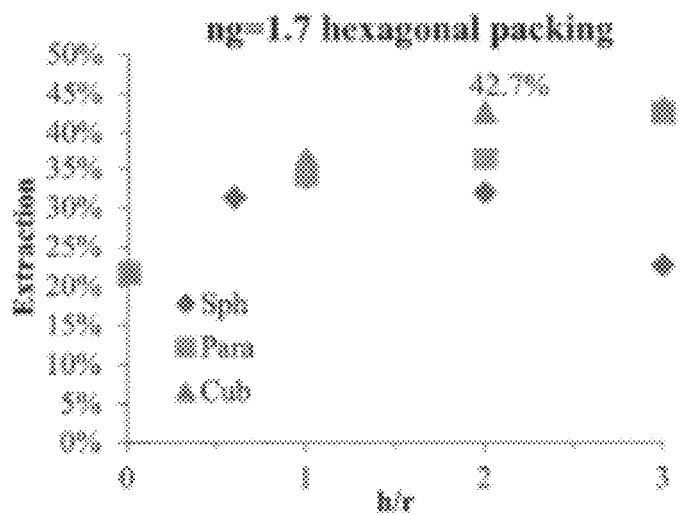

Ray tracing simulations demonstrate that significantly more efficient outcoupling can be obtained for parabolic and cubic microlenses than spherical microlenses. Spherical microlenses exhibit optimal outcoupling when H/R=1. For H/R<1 outcoupling from parabolic or cubic microlens arrays is inferior to spherical microlenses. However, for H/R>1, improved outcoupling can be obtained for parabolic and cubic arrays than that obtained for spherical arrays at H/R=1 as shown in FIGS. 26A and 26B, which show the integrated light extraction of hexagonal close packed microlens arrays. Light extraction in FIG. 26A is presented as a percentage of light generated in the OLED emissive layer that is outcoupled to air. FIG. 26A shows light extraction from a substrate and microlens array with n=1.5. Light extraction in FIG. 26B is normalized to the case of an OLED on a planar substrate of index of refraction n=1.5. FIG. 26B shows light extraction for the n=1.7 case. Light extraction is plotted as a function of H/R for lens profiles matching equations 10.1 (square), 10.2 (diamond) and 10.3 (triangle), as described above. The case of spherical lenses with H/R>1 was modeled using an array of hemispheres on cylindrical pedestals. Ratios of H/R of up to 10 were tested for various curvatures. Optimal outcoupling for parabolic and cubic arrays is achieved at H/R=2. A 166% enhancement over a plain glass array was achieved for a hexagonal pack of cubic microlenses with index n=1.5 at H/R=2.

Figure 27A:
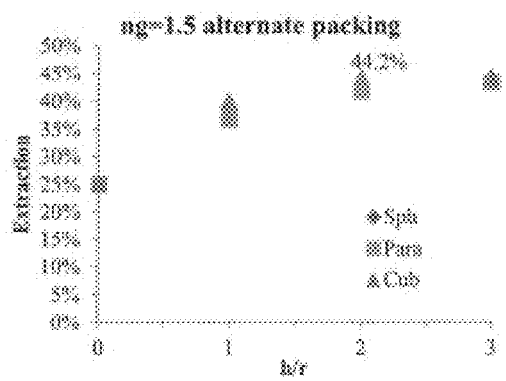
FIGS. 27A-27D show the integrated light extraction of an optimally packed microlens array having two differently sized microlenses for various indices of refraction as disclosed herein.
Figure 27B:
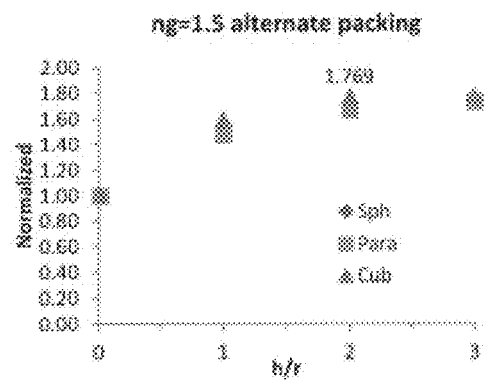
Figure 27C:
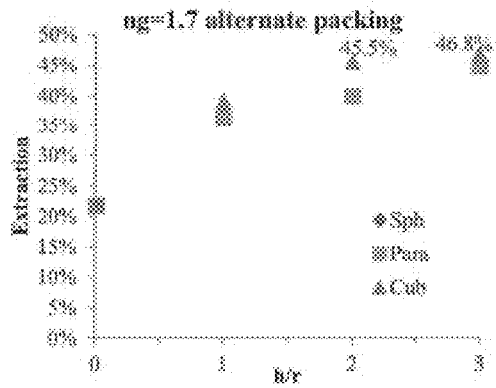
Figure 27D:
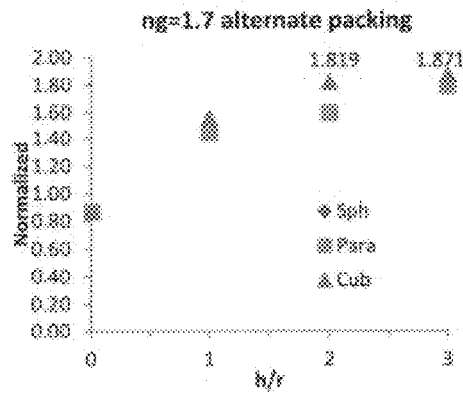

Packing of microlenses can be improved by incorporating lenses of two different sizes into the array as previously described. The dimensions of the smaller microlenses are 0.6376× that of the larger microlenses. This improved packing increases the fill factor of the microlens array, leading to an overall improvement in outcoupling. FIGS. 27A-D show the integrated light extraction of an optimally packed microlens array comprised of two differently sized lenses. FIGS. 27A and 27C show light extraction presented as a percentage of light generated in the OLED emissive layer that is outcoupled to air, for n=1.5 and n=1.7, respectively. FIGS. 27B and 27D show light extraction normalized to the case of an OLED on a planar substrate for n=1.5 and n=1.7, respectively. Light extraction was plotted as a function of H/R for lens profiles matching equations 10.1 (square), 10.2 (diamond) and 10.3 (triangle), as discussed above. As shown, a 177% enhancement over a plain glass array is achieved for cubic two size array microlenses with index n=1.5 at H/R=2. Using microlenses with more than 2 different sizes can further improve the fill factor of microlens, and thus improve light extraction.

It was found that outcoupling can be further enhanced by using a high index substrate to avoid loss of light between the device and substrate. Simulation indicates that an outcoupling efficiency improvement of 171% can be achieved by cubic lenses with HI R=2 for a substrate with index n=1.7 compared with a planar substrate of n=1.5. Microlenses help to mitigate the outcoupling loss at the substrate/air interface to allow for a net improvement in outcoupling. If the novel, two lens size packing structure is applied, an outcoupling improvement of 187% can be achieved by cubic lenses of HI R=3 for a substrate with an index of n=1.7.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. An organic light emitting device comprising:
    a substrate;
    a transparent first electrode having a first index of refraction, disposed adjacent to the substrate;
    a second electrode;
    an organic emissive layer disposed between the transparent first electrode and the second electrode, the organic emissive layer having a second index of refraction;
    layer disposed between the substrate and the transparent first electrode, comprising:
        a first material having an index of refraction at least 0.01 greater than the second index of refraction, and
        a non-planar interface between the first material and a material adjacent to the first material; and
    an external extraction layer disposed adjacent to the substrate, wherein the external extraction layer outcouples light from the substrate and the substrate is disposed between the internal extraction layer and the external extraction layer;
    wherein the internal extraction layer comprises at least on material having an index of refraction that is greater than the index of refraction of the substrate and less than the first index of refraction.

2. The device of claim 1, wherein the internal extraction layer further comprises a second material having a third index of refraction different than the index of refraction of the first material.

3. The device of claim 2, wherein the first material has an index of refraction of not less than 1.7.

4. The device of claim 2, wherein the first material has an index of refraction of not less than 1.9.

5. The device of claim 2, wherein the non-planar interface is an interface between the first material and the second material.

6. The device of claim 5, wherein the internal extraction layer further comprises a second non-planar interface between the first material and the substrate.

7. The device of claim 1, wherein the non-planar interface is an interface between the first material and the substrate.

8. The device of claim 7, wherein the non-planar interface comprises a topographical pattern selected from the group consisting of: grooves, pyramidal features, and prismatic features.

9. The device of claim 1, wherein the index of refraction of the first material is at least 0.01 higher than the first index of refraction.

10. The device of claim 1, wherein the substrate comprises a first substrate material, and the external extraction layer comprises the first substrate material.

11. The device of claim 1, wherein the substrate has an index of refraction of not less than 1.65.

12. The device of claim 1, wherein the external extraction layer has an index of refraction within 0.01 of the index of refraction of the substrate.

13. The device of claim 1, wherein the non-planar interface comprises a topographical pattern selected from the group consisting of: grooves, pyramidal features, and prismatic features.

14. The device of claim 1, wherein the external extraction layer comprises a non-planar surface.

15. The device of claim 14, wherein the non-planar surface comprises a topographical pattern selected from the group consisting of: grooves, hemispherical features, and axially symmetric cubic profile features.

16. The device of claim 1, wherein the internal extraction layer has a minimum thickness of at least 1 μm.

17. The device of claim 1, wherein the external extraction layer comprises a plurality of micro lenses.

18. The device of claim 17, wherein, for each microlens of the plurality of microlenses, each point on a surface of the micro lens has a tangent plane that forms an interior angle of not more than 90 degrees with an interface of the outcoupling layer and the organic light emitting device; and wherein each micro lens of the plurality of micro lenses has a lens height H and a largest base measurement 2R, and H/R is greater than 1.

19. The device of claim 17, wherein each microlens of the plurality of microlenses has a thickness profile defined by a continuous function in r, wherein r is the distance from an axis of the micro lens centered on the base of the micro lens and normal to the interface of the outcoupling layer with the organic light emitting device, and wherein r is less than or equal to R.

20. The device of claim 17, wherein the plurality of microlenses are closely packed.

21. The device of claim 17, wherein at least one microlens of the plurality of microlenses has a base measurement $2R_1$ and at least one microlens of the plurality of microlenses has a base measurement $2R_2$, and wherein $R_1$ is different from $R_2$.

22. The device of claim 21, wherein the plurality of microlenses are arranged in a repeating pattern.

\* \* \* \* \*